US010551692B2

(12) United States Patent
Chen et al.

(10) Patent No.: US 10,551,692 B2
(45) Date of Patent: Feb. 4, 2020

(54) ARRAY SUBSTRATE AND LIQUID CRYSTAL DISPLAY PANEL

(71) Applicant: Shenzhen China Star Optoelectronics Technology Co., Ltd., Shenzhen (CN)

(72) Inventors: Cheng Hung Chen, Shenzhen (CN); Jiali Jiang, Shenzhen (CN)

(73) Assignee: Shenzhen China Star Optoelectronics Technology Co., Ltd., Shenzhen, Guangdong (CN)

(*) Notice: Subject to any disclaimer, the term of this patent is extended or adjusted under 35 U.S.C. 154(b) by 26 days.

(21) Appl. No.: 14/907,903

(22) PCT Filed: Oct. 28, 2015

(86) PCT No.: PCT/CN2015/093097
§ 371 (c)(1),
(2) Date: Jan. 31, 2018

(87) PCT Pub. No.: WO2017/054273
PCT Pub. Date: Apr. 6, 2017

(65) Prior Publication Data
US 2018/0149930 A1 May 31, 2018

(30) Foreign Application Priority Data
Sep. 30, 2015 (CN) .......................... 2015 1 0634590

(51) Int. Cl.
*G02F 1/1343* (2006.01)
*G02F 1/1362* (2006.01)
(Continued)

(52) U.S. Cl.
CPC ...... *G02F 1/134336* (2013.01); *G02F 1/1368* (2013.01); *H01L 27/124* (2013.01);
(Continued)

(58) Field of Classification Search
None
See application file for complete search history.

(56) References Cited

U.S. PATENT DOCUMENTS

2004/0085503 A1    5/2004  Kim et al.
2004/0217931 A1   11/2004  Shin
(Continued)

FOREIGN PATENT DOCUMENTS

CN    1550854 A    12/2004
CN    1892787 A     1/2007
(Continued)

OTHER PUBLICATIONS

Notification of Transmittal of the International Search Report and the Written Opinion of the International Searching Authority (Forms PCT/ISA/237, PCT/ISA/210, and PCT/ISA/220) dated Jun. 27, 2016, by the State Intellectual Property Office of People's Republic of China in corresponding International Application No. PCT/CN2015/093097. (11 pages).
(Continued)

*Primary Examiner* — Robert K Carpenter
(74) *Attorney, Agent, or Firm* — Mintz Levin Cohn Ferris Glovsky and Popeo, P.C.; Steven M. Jensen

(57) ABSTRACT

Disclosed are an array substrate and a liquid crystal display panel. The array substrate includes a plurality of gate lines and a plurality of data lines. The plurality of gate lines and the plurality of data lines are interleaved to form a plurality of pixel areas, and a pixel electrode is formed in each of the pixel areas. The pixel electrode is connected to a corresponding gate line and a corresponding data line via a thin film transistor. The array substrate further includes a common electrode, which is connected to a first pixel electrode and a second electrode via a thin film transistor. A signal in the first pixel electrode and a signal in the second pixel electrode have opposite polarities. The array substrate real-
(Continued)

izes automatic adjustment of a common electrode voltage, and corresponding regulators or machines are no longer needed. It is favorable to improvement of productivity and competitiveness of the array substrate and the liquid crystal display panel.

19 Claims, 5 Drawing Sheets

(51) Int. Cl.
  *G02F 1/1368* (2006.01)
  *H01L 27/12* (2006.01)
(52) U.S. Cl.
  CPC .................. *G02F 1/136286* (2013.01); *G02F 2001/136222* (2013.01); *G02F 2201/121* (2013.01); *G02F 2201/123* (2013.01)

(56) References Cited

U.S. PATENT DOCUMENTS

| | | | |
|---|---|---|---|
| 2005/0243045 A1* | 11/2005 | Kim | G09G 3/3659 345/87 |
| 2006/0139240 A1 | 6/2006 | Oinuma et al. | |
| 2007/0001960 A1 | 1/2007 | Kim et al. | |
| 2008/0062341 A1 | 3/2008 | Tanaka | |
| 2009/0251398 A1 | 10/2009 | Lee et al. | |
| 2010/0245326 A1 | 9/2010 | Xiao | |
| 2015/0162350 A1 | 6/2015 | Chen et al. | |
| 2015/0309380 A1 | 10/2015 | Xu | |
| 2016/0299392 A1 | 10/2016 | Cheng et al. | |
| 2017/0123256 A1 | 5/2017 | Li et al. | |

FOREIGN PATENT DOCUMENTS

| | | |
|---|---|---|
| CN | 101140744 A | 3/2008 |
| CN | 101369408 A | 2/2009 |
| CN | 101551561 A | 10/2009 |
| CN | 101847376 A | 9/2010 |
| CN | 102998858 A | 3/2013 |
| CN | 103676385 A | 3/2014 |
| CN | 103913913 A | 7/2014 |
| CN | 204101858 U | 1/2015 |
| CN | 204595398 U | 8/2015 |
| JP | 2006-162707 A | 6/2006 |

OTHER PUBLICATIONS

Office Action dated Sep. 12, 2017, by the State Intellectual Property Office of People's Republic of China in corresponding Chinese Patent Application No. 201510634590.8. (8 pages).

Jiang, Pingban Xianshi Qudong Jishu, Aug. 31, 2014, p. 173. (3 pages).

* cited by examiner

ARRAY SUBSTRATE AND LIQUID CRYSTAL DISPLAY PANEL

CROSS-REFERENCE TO RELATED APPLICATIONS

This application claims the priority of Chinese patent application CN 201510634590.8, entitled "Array substrate and liquid crystal display panel" and filed on Sep. 30, 2015, the entirety of which is incorporated herein by reference.

FIELD OF THE INVENTION

The present disclosure relates to the technical field of liquid crystal display, and in particular, to an array substrate and a liquid crystal display panel.

BACKGROUND OF THE INVENTION

A common electrode signal ($V_{COM}$ signal) plays a very important role in a liquid crystal display panel. For the liquid crystal display panel, whether the panel works under an optimal $V_{COM}$ signal would directly affect display quality of the panel. When the liquid crystal display panel does not work under its optimal Vow signal, brightness and images of the panel will be affected. When the $V_{COM}$ signal applied to the liquid crystal display panel is greatly deviated from its optimal $V_{COM}$ signal, sensitive users may feel a flicker of pictures of the liquid crystal display panel, and even feel dizzy. In addition, when the $V_{COM}$ signal applied to the liquid crystal display panel is greatly deviated from its optimal $V_{COM}$ signal, the liquid crystal display panel may also have a problem of DC residual.

Therefore, a $V_{COM}$ signal would be adjusted for each liquid crystal display panel before shipment, so that the liquid crystal display panel works under its optimal $V_{COM}$ signal. However, such signal adjustment is usually manually finished by operating personnel or automatically finished by machines, which will cause problems such as increased personnel costs, increased machine costs, and capacity losses, and eventually increase production costs, thereby affecting product competitiveness.

SUMMARY OF THE INVENTION

The problem to be solved by the present disclosure is to maintain a common electrode signal in an array substrate near an optimal common electrode signal $V_{COM}$ effectively. In order to solve the above problem, the present disclosure first provides an array substrate. The array substrate comprises a plurality of gate lines and a plurality of data lines. The plurality of gate lines and the plurality of data lines are interleaved to form a plurality of pixel areas, and a pixel electrode is formed in each of the pixel areas. The pixel electrode is connected to a corresponding gate line and a corresponding data line via a thin film transistor. The array substrate further comprises a common electrode, which is connected to a first pixel electrode and a second pixel electrode via a thin film transistor. A signal in the first pixel electrode and a signal in the second pixel electrode have opposite polarities.

According to an embodiment of the present disclosure, the first pixel electrode and the second pixel electrode are two pixel electrodes in adjacent pixel electrode rows or adjacent pixel electrode columns.

According to an embodiment of the present disclosure, the common electrode is connected to the first pixel electrode via a first thin film transistor and connected to the second pixel electrode via a second thin film transistor. A gate and a source of the first thin film transistor are connected to a first gate line and the first pixel electrode, respectively. A gate and a source of the second thin film transistor are connected to the first gate line and the second pixel electrode, respectively. A drain of the first thin film transistor and a drain of the second thin film transistor both are connected to the common electrode.

According to an embodiment of the present disclosure, the first pixel electrode and the second pixel electrode are respectively connected to a second gate line and a third gate line via corresponding thin film transistors.

According to an embodiment of the present disclosure, the common electrode is connected to a plurality of pixel electrodes in a pixel electrode row where the first pixel electrode is located, and the common electrode is further connected to a plurality of pixel electrodes in a pixel electrode row where the second pixel electrode is located; or the common electrode is connected to a plurality of pixel electrodes in a pixel electrode column where the first pixel electrode is located, and the common electrode is further connected to a plurality of pixel electrodes in a pixel electrode column where the second pixel electrode is located.

According to an embodiment of the present disclosure, the common electrode comprises a plurality of common electrode lines. The plurality of common electrode lines are arranged side by side along a direction of the data lines, or the plurality of common electrode lines are arranged side by side along a direction of the gate lines.

According to an embodiment of the present disclosure, the common electrode comprises a plurality of common electrode lines, which comprise a plurality of row common electrode lines and a plurality of column common electrode lines. The plurality of row common electrode lines are arranged side by side along the direction of the gate lines, and the plurality of column common electrode lines are arranged side by side along the direction of the data lines.

According to an embodiment of the present disclosure, the array substrate further comprises a signal output terminal which is connected to the common electrode and configured to output signals of the common electrode.

The present disclosure further provides a liquid crystal display panel, which comprises an array substrate as described above.

According to an embodiment of the present disclosure, the liquid crystal display panel further comprises a color filter. The color filter comprises a common electrode, and the common electrode in the color filter is connected to the common electrode in the array substrate.

According to the present disclosure, a voltage of the common electrode in the array substrate and the liquid crystal display panel does not need to be provided by additionally arranging a corresponding power supply circuit, but can be provided by the pixel electrodes of the array substrate itself.

In the meanwhile, a common electrode voltage obtained by the common electrode of the array substrate can be stabilized in an intermediate state (i.e., near an optimal common electrode signal $V_{COM}$) of a positive voltage and a negative voltage of the pixel electrodes (with respect to the common electrode). Moreover, if necessary, the obtained voltage can be output to a common electrode of an opposite substrate (for example, a color filter substrate).

Compared with an existing array substrate, the array substrate provided by the present disclosure realizes automatic adjustment of the common electrode voltage. Hence corresponding regulators or machines are no longer needed. It is favorable to improvement of productivity and competitiveness of the array substrate and the liquid crystal display panel.

Other features and advantages of the present disclosure will be further explained in the following description, and partially become self-evident therefrom, or be understood through the embodiments of the present disclosure. The objectives and advantages of the present disclosure will be achieved through the structure specifically pointed out in the description, claims, and the accompanying drawings.

BRIEF DESCRIPTION OF THE DRAWINGS

In order to describe the technical solution in the embodiments of the present disclosure or in the prior art more clearly, the accompanying drawings required for describing the embodiments or the prior art will be briefly introduced below. In the drawings.

DETAILED DESCRIPTION OF THE EMBODIMENTS

The present disclosure will be explained in detail with reference to the embodiments and the accompanying drawings, whereby it can be fully understood how to solve the technical problem by the technical means according to the present disclosure and achieve the technical effects thereof, and thus the technical solution according to the present disclosure can be implemented. It should be noted that, as long as there is no structural conflict, all the technical features mentioned in all the embodiments may be combined together in any manner, and the technical solutions obtained in this manner all fall within the scope of the present disclosure.

In the meanwhile, in the following description, many specific details are set forth for the purpose of explanation so as to provide a thorough understanding of the embodiments of the present disclosure. However, it would be obvious for those skilled in the art that the present disclosure may be implemented without practice of the specific details or specific ways described herein.

Figure 1:
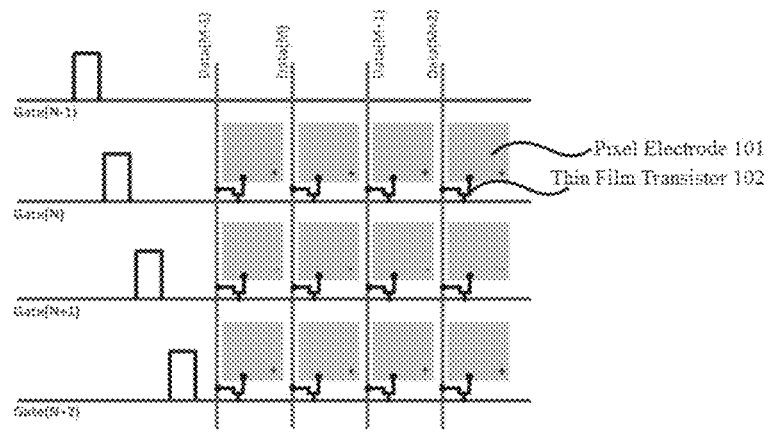
FIG. 1 schematically shows a structure of an array substrate in the prior art.

FIG. 1 schematically shows a structure of an array substrate in a liquid crystal display panel in the prior art.

As shown in FIG. 1, the array substrate in the prior art comprises a plurality of data lines and a plurality of gate lines. The data lines and the gate lines are interleaved to form a plurality of pixel areas, and pixel electrodes 101 are formed in the respective pixel areas. Each of the pixel electrodes 101 is connected to a corresponding gate line and a corresponding data line via a corresponding thin film transistor 102. Specifically, a pixel electrode 101 is connected to a drain of a corresponding thin film transistor 102, and a gate and a source of the thin film transistor 102 are respectively connected to a corresponding gate line and a corresponding data line.

It should be noted that, in the structure of the array substrate schematically shown in FIG. 1, a schematic manner of the gate lines, the data lines and the pixel electrodes does not mean that components like the gate lines, the data lines, and the pixel electrodes must be in a same material layer.

In driving manners of a liquid crystal display panel, there is a row inversion driving mode. As shown in FIG. 1, in the row inversion driving mode, polarities of pixel electrodes (with respect to a common electrode) along a direction of the data lines are distributed in an alternating manner of "positive, negative, positive, negative" or "negative, positive, negative, positive", and positive polarities and negative polarities are basically in equilibrium.

A liquid crystal display panel provided by the present disclosure is based on the above driving characteristics to obtain a common electrode voltage $V_{COM}$ stabilized in an intermediate state of a voltage of positive electrodes and a voltage of negative electrodes.

Figure 2:
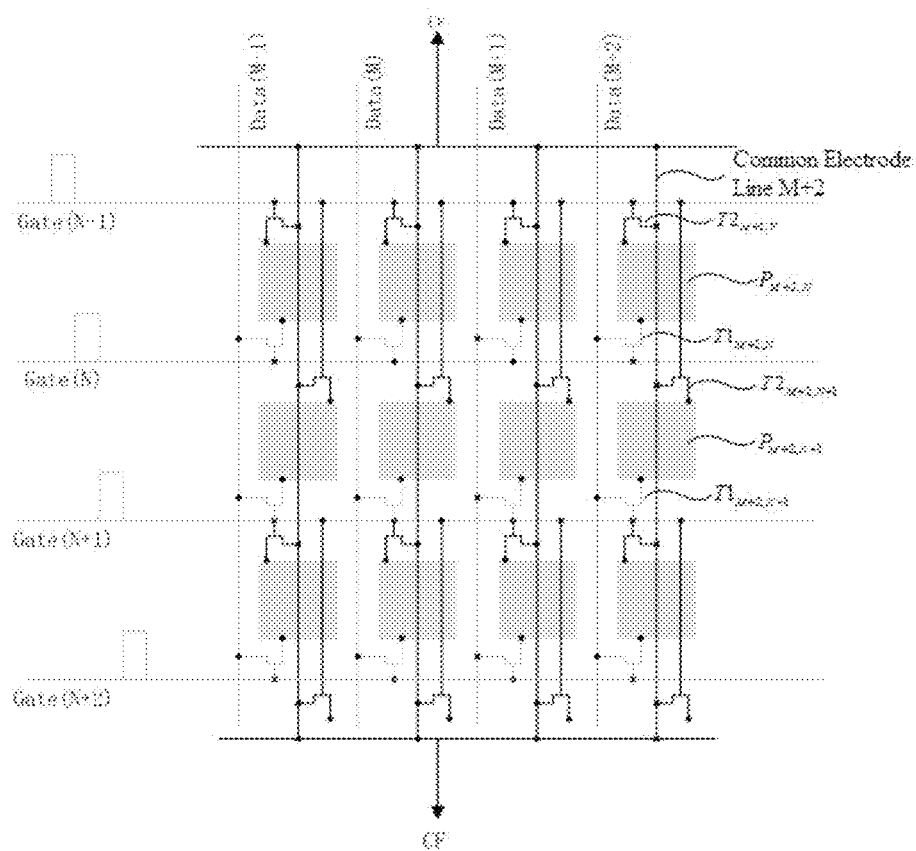
FIG. 2 schematically shows a structure of an array substrate in a UV2A type liquid crystal display panel according to an embodiment of the present disclosure.

FIG. 2 schematically shows a structure of an array substrate provided in the present embodiment. The array substrate is used in a UV2A type liquid crystal display panel, and the panel is driven by a row inversion driving mode. As shown in FIG. 2, in the array substrate provided in the present embodiment, a common electrode is added based on the array substrate as shown in FIG. 1. The common electrode is connected to a pixel electrode via a thin film transistor.

A part of the array substrate as shown in FIG. 2 is taken as an example. A plurality of pixel areas are formed by interleaved four gate lines from an $(N-1)^{th}$ gate line to an $(N+2)^{th}$ gate line and four data lines from an $(M-1)^{th}$ data line to an $(M+2)^{th}$ data line. Pixel electrodes are formed in respective pixel areas. Each of the pixel electrodes is connected to a corresponding gate line and a corresponding data line via a thin film transistor. For example, a pixel electrode $P_{M+2,N}$, as a first pixel electrode, is connected to the $N^{th}$ gate line and the $(M+2)^{th}$ data line via a thin film transistor $T1_{M+2,N}$, and a pixel electrode $P_{M+2,N+1}$, as a second pixel electrode, is connected to an $(N+1)^{th}$ gate line and the $(M+2)^{th}$ data line via a thin film transistor $T1_{M+2,N+1}$.

In the present embodiment, the common electrode comprises a plurality of common electrode lines. The common electrode lines are arranged side by side along a direction of the data lines (namely, a direction of the common electrode lines is approximately the same as the direction of the data lines), and each of the common electrode lines is connected to a corresponding pixel electrode via a corresponding thin film transistor. Specifically, as shown in FIG. 2, an $(M+2)^{th}$ common electrode line is connected to a drain of a first thin film transistor $T2_{M+2,N}$; the pixel electrode $P_{M+2,N}$ is connected to a source of the first thin film transistor $T2_{M+2,N}$;

and a gate of the first thin film transistor $T2_{M+2,N}$ is connected to the $(N-1)^{th}$ gate line.

In the meanwhile, the $(M+2)^{th}$ common electrode line is further connected to a drain of a second thin film transistor $T2_{M+2,N+1}$; the second pixel electrode $P_{M+2,N+1}$ is connected to a source of the second thin film transistor $T2_{M+2,N+1}$; and a gate of the second thin film transistor $T2_{M+2,N+1}$ is connected to the $(N-1)^{th}$ gate line.

Similarly, the $(M+2)^{th}$ common electrode line is further connected to other pixel electrodes corresponding to the $(M+2)^{th}$ data line via corresponding thin film transistors, and other common electrode lines are connected to corresponding pixel electrodes in a same manner.

When the $(N-1)^{th}$ gate line (namely, Gate (N-1)) is at a high electric potential, since the gate of the first thin film transistor $T2_{M+2,N}$ and the gate of the second thin film transistor $T2_{M+2,N+1}$ both are connected to the $(N-1)^{th}$ gate line, the first thin film transistor $T2_{M+2,N}$ and the second thin film transistor $T2_{M+2,N+1}$ are in an ON state, thereby transmitting electric potentials of a previous frame stored in the pixel electrode $P_{M+2,N}$ and the pixel electrode $P_{M+2,N+1}$ to the $(M+2)^{th}$ common electrode line. Similarly, electric potentials stored in respective pixel electrodes corresponding to the $N^{th}$ gate line and the $(N+1)^{th}$ gate line all would be transmitted to corresponding common electrode lines via corresponding thin film transistors.

Since the array substrate provided by the present embodiment is driven in a row inversion driving mode and the $N^{th}$ gate line and the $(N+1)^{th}$ gate line are two adjacent gate lines, electric potentials on pixel electrodes corresponding to the two gate lines have opposite polarities (with respect to the common electrode). Since the common electrode lines are connected to one another, a voltage on the common electrode is stabilized in an intermediate state of a positive voltage and a negative voltage of the pixel electrodes. Thus, a required common electrode voltage is obtained.

The array substrate provided by the present embodiment is an array substrate applied in a UV2A type liquid crystal display panel, and a color filter of the UV2A type liquid crystal display panel also comprises a common electrode. Therefore, the common electrode in the color filter can be connected to a signal output terminal of the common electrode in the array substrate, so that an electric potential of the common electrode in the color filter is also stabilized in an intermediate state of a positive voltage and a negative voltage (with respect to the common electrode) of the pixel electrodes.

Of course, in other embodiments of the present disclosure, the common electrode does not need to be connected to all the pixel electrodes via thin film transistors. For example, in an embodiment of the present disclosure, the common electrode may only be connected to all or part of pixel electrodes corresponding to the $(M+2)^{th}$ data line.

Figure 3:
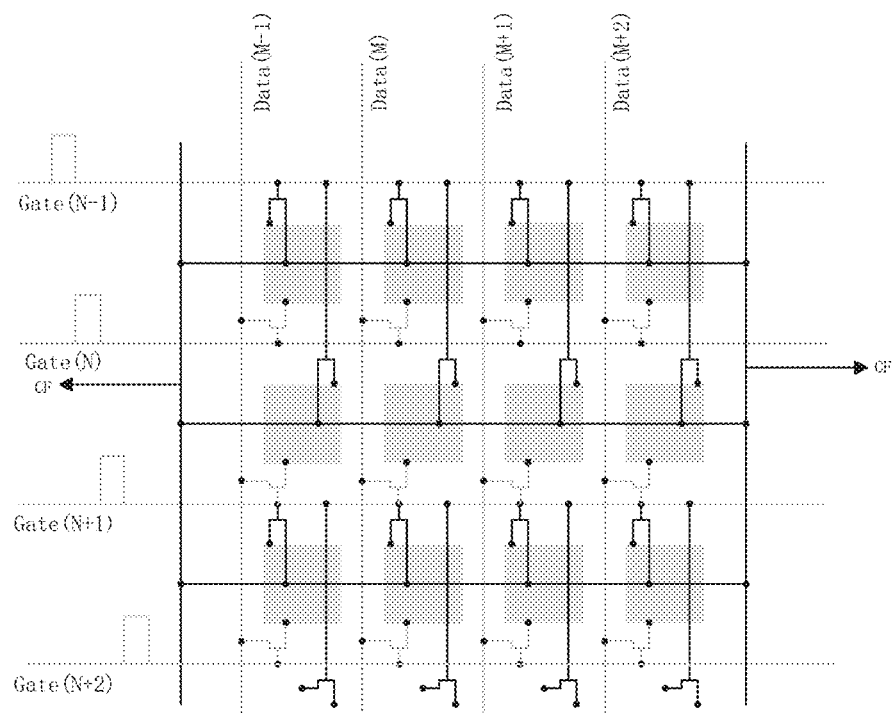
FIG. 3 schematically shows a structure of an array substrate in a UV2A type liquid crystal display panel according to an embodiment of the present disclosure.
Figure 4:
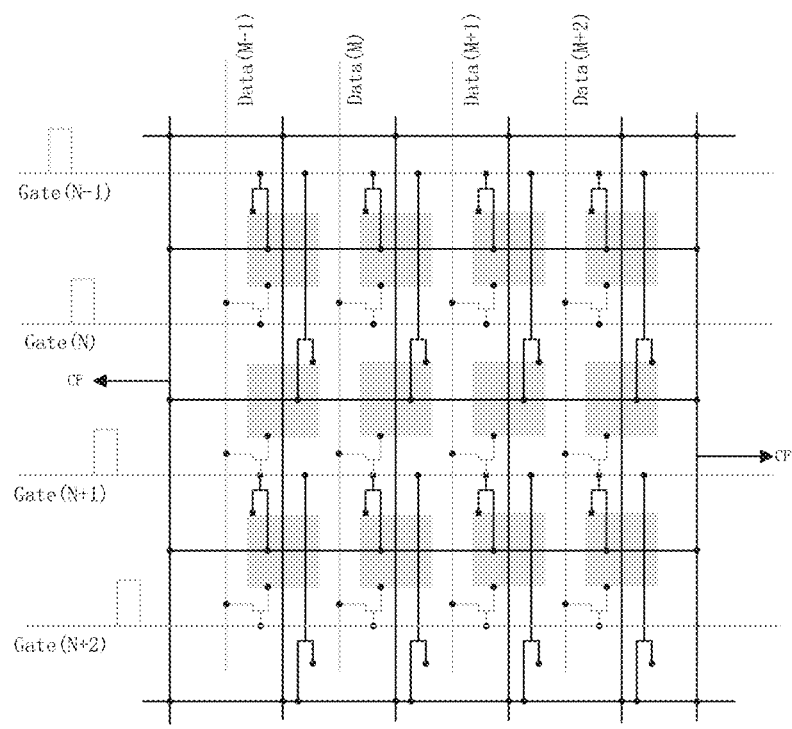
FIG. 4 schematically shows a structure of an array substrate in a UV2A type liquid crystal display panel according to an embodiment of the present disclosure.

It should be noted that, in other embodiments of the present disclosure, the common electrode lines can be arranged in other proper manners, and the present disclosure is not limited thereto. For example, in different embodiments of the present disclosure, the common electrode lines can be arranged side by side along a direction of the gate lines, as shown in FIG. 3. The common electrode lines can also be arranged in a manner as shown in FIG. 4, i.e., part of the common electrode lines (namely, row common electrode lines) are arranged side by side along the direction of the gate lines, and part of the common electrode lines (namely, column common electrode lines) are arranged side by side along the direction of data lines.

Figure 5:
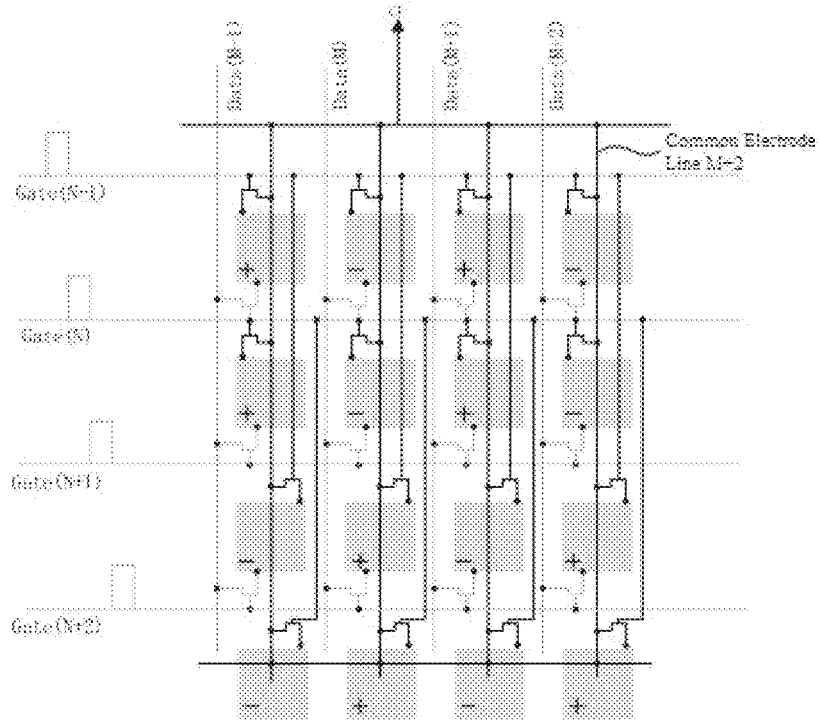
FIG. 5 schematically shows a structure of an array substrate in a UV2A type liquid crystal display panel according to an embodiment of the present disclosure.

In addition, it also should be noted that, when the array substrate is driven in other manners, based on a principle provided by the present disclosure, corresponding structural forms of the common electrode lines can be adopted, and the present disclosure is not limited thereto. For example, in an embodiment of the present disclosure, a column inversion driving mode is used in an array substrate. In the array substrate, common electrode lines can be in a structural form provided by the present embodiment. In another embodiment of the present disclosure, when a 2-line inversion driving mode is used in an array substrate, a structure of common electrode lines as shown in FIG. 5 can be used in the array substrate.

Besides, it should also be noted that, in other embodiments of the present disclosure, a liquid crystal display panel can also be other panels of a proper type (for example, vertical alignment liquid crystal display panels, such as a MVA type liquid crystal display panel and a PVA type liquid crystal display panel), and the present disclosure is not limited thereto.

Figure 6:
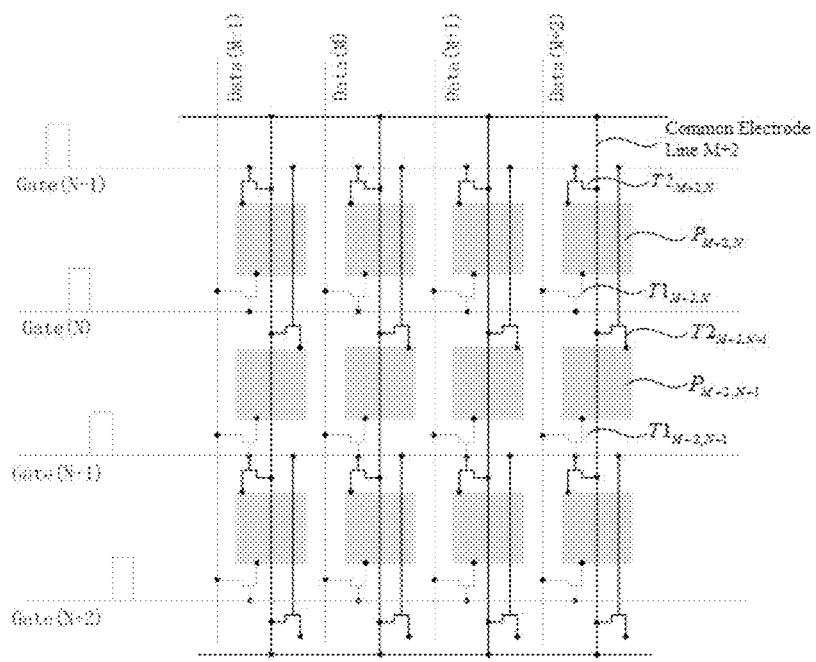
FIG. 6 schematically shows a structure of an array substrate in an FFS type liquid crystal display panel according to an embodiment of the present disclosure.
Figure 7:
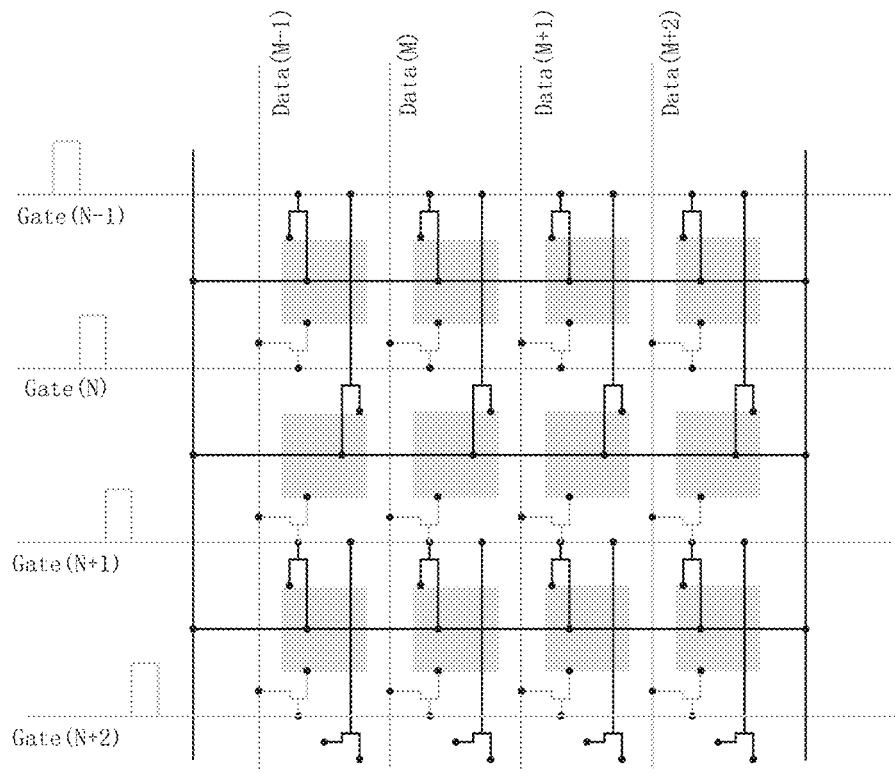
FIG. 7 schematically shows a structure of an array substrate in an FFS type liquid crystal display panel according to an embodiment of the present disclosure.
Figure 8:
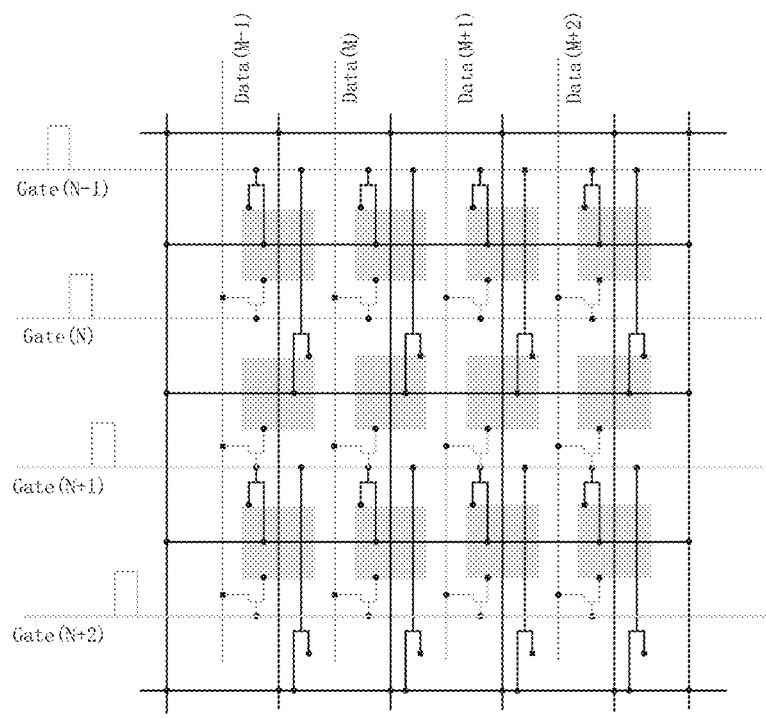
FIG. 8 schematically shows a structure of an array substrate in an FFS type liquid crystal display panel according to an embodiment of the present disclosure.

It should be pointed out that, in other embodiments of the present disclosure, if a liquid crystal display panel is an IFS type panel, structures as shown in FIGS. 6 to 8 can be adopted in an array substrate of the liquid crystal display panel. The structures of the array substrate and a principle for realizing automatic adjustment of a common electrode voltage are similar to those of the array substrate in the UV2A type liquid crystal display panel described above, and specific details will not be described here. It should be pointed out that, an opposite substrate of this type of array substrate comprises no common electrode, and therefore a signal on the array substrate does not need to be output to the opposite substrate. Thus, in the array substrate of the FFS type liquid crystal display panel, a common electrode does not need to be provided with a signal output terminal for outputting a common electrode voltage to an opposite substrate.

It can be seen from the above description that, a voltage of the common electrode in the array substrate and the liquid crystal display panel provided by the present embodiment does not need to be provided by additionally arranging a corresponding power supply circuit, but can be provided by the pixel electrodes of the array substrate itself.

In the meanwhile, an obtained common electrode voltage can be stabilized in an to intermediate state of a positive voltage and a negative voltage of the pixel electrodes (with respect to the common electrode). Moreover, if necessary, the obtained voltage can be output to a common electrode of an opposite substrate (for example, a color filter substrate).

Compared with an existing array substrate, the array substrate provided by the present disclosure realizes automatic adjustment of the common electrode voltage. Hence corresponding regulators or machines are no longer needed. It is favorable to improvement of productivity and competitiveness of the array substrate and the liquid crystal display panel.

It should be understood that, the embodiments of the present disclosure are not limited to the particular structures disclosed herein, but are extended to equivalents thereof as would be recognized by those ordinarily skilled in the relevant arts. It should also be understood that, terminologies used herein are used for the purpose of describing particular embodiments only and are not intended to be limiting.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment.

Furthermore, the described features, structures, or characteristics may be combined in any, suitable manner in one or more embodiments. In other instances, well-known structures, materials, or operations are not shown or described in detail to avoid obscuring aspects of the present disclosure.

While the foregoing embodiments are illustrative of the principles of the present disclosure in one or more particular applications, it will be apparent to those skilled in the art that numerous modifications in form, usage, and details of implementation can be made without the exercise of inventive faculty, and without departing from the principles and concepts of the present disclosure. Accordingly, it is not intended that the present disclosure be limited, except as by the claims set forth below.

The invention claimed is:

1. An array substrate, comprising a plurality of gate lines and a plurality of data lines, wherein the plurality of gate lines and the plurality of data lines are interleaved to form a plurality of pixel areas, a pixel electrode is formed in each of the pixel areas, and the pixel electrode is connected to a corresponding gate line and a corresponding data line via a thin film transistor,
wherein the array substrate further comprises a common electrode, which is connected to a first pixel electrode and a second pixel electrode via a thin film transistor, wherein a signal in the first pixel electrode and a signal in the second pixel electrode have opposite polarities, and
wherein a voltage of the common electrode is provided by the pixel electrode.

2. The array substrate according to claim 1, wherein the first pixel electrode and the second pixel electrode are two pixel electrodes in adjacent pixel electrode rows or adjacent pixel electrode columns.

3. The array substrate according to claim 2, wherein the common electrode is connected to the first pixel electrode via a first thin film transistor and connected to the second pixel electrode via a second thin film transistor,
wherein a gate and a source of the first thin film transistor are connected to a first gate line and the first pixel electrode, respectively;
wherein a gate and a source of the second thin film transistor are connected to the first gate line and the second pixel electrode, respectively; and
wherein a drain of the first thin film transistor and a drain of the second thin film transistor both are connected to the common electrode.

4. The array substrate according to claim 1, wherein the common electrode is connected to the first pixel electrode via a first thin film transistor and connected to the second pixel electrode via a second thin film transistor,
wherein a gate and a source of the first thin film transistor are connected to a first gate line and the first pixel electrode, respectively;
wherein a gate and a source of the second thin film transistor are connected to the first gate line and the second pixel electrode, respectively; and
wherein a drain of the first thin film transistor and a drain of the second thin film transistor both are connected to the common electrode.

5. The array substrate according to claim 4, wherein the first pixel electrode and the second pixel electrode are respectively connected to a second gate line and a third gate line via corresponding thin film transistors.

6. The array substrate according to claim 1, wherein:
the common electrode is connected to a plurality of pixel electrodes in a pixel electrode row where the first pixel electrode is located, and the common electrode is further connected to a plurality of pixel electrodes in a pixel electrode row where the second pixel electrode is located; or
the common electrode is connected to a plurality of pixel electrodes in a pixel electrode column where the first pixel electrode is located, and the common electrode is further connected to a plurality of pixel electrodes in a pixel electrode column where the second pixel electrode is located.

7. The array substrate according to claim 1, wherein the common electrode comprises a plurality of common electrode lines,
wherein the plurality of common electrode lines are arranged side by side along a direction of the data lines, or the plurality of common electrode lines are arranged side by side along a direction of the gate lines.

8. The array substrate according to claim 1, wherein the common electrode comprises a plurality of common electrode lines, which comprise a plurality of row common electrode lines and a plurality of column common electrode lines, wherein the plurality of row common electrode lines are arranged side by side along the direction of the gate lines, and the plurality of column common electrode lines are arranged side by side along the direction of the data lines.

9. The array substrate according to claim 1, further comprising a signal output terminal which is connected to the common electrode and configured to output signals of the common electrode to a common electrode of an opposite substrate.

10. A liquid crystal display panel, comprising an array substrate, wherein the array substrate comprises a plurality of gate lines and a plurality of data lines, the plurality of gate lines and the plurality of data lines are interleaved to form a plurality of pixel areas, a pixel electrode is formed in each of the pixel areas, and the pixel electrode is connected to a corresponding gate line and a corresponding data line via a thin film transistor,
wherein the array substrate further comprises a common electrode, which is connected to a first pixel electrode and a second pixel electrode via a thin film transistor, wherein a signal in the first pixel electrode and a signal in the second pixel electrode have opposite polarities, and
wherein a voltage of the common electrode is provided by the pixel electrode.

11. The liquid crystal display panel according to claim 10, wherein the first pixel electrode and the second pixel electrode are two pixel electrodes in adjacent pixel electrode rows or adjacent pixel electrode columns.

12. The liquid crystal display panel according to claim 11, wherein the common electrode is connected to the first pixel electrode via a first thin film transistor and connected to the second pixel electrode via a second thin film transistor,
wherein a gate and a source of the first thin film transistor are connected to a first gate line and the first pixel electrode, respectively;
wherein a gate and a source of the second thin film transistor are connected to the first gate line and the second pixel electrode, respectively; and wherein a drain of the first thin film transistor and a drain of the second thin film transistor both are connected to the common electrode.

13. The liquid crystal display panel according to claim 10, wherein the common electrode is connected to the first pixel electrode via a first thin film transistor and connected to the second pixel electrode via a second thin film transistor,
   wherein a gate and a source of the first thin film transistor are connected to a first gate line and the first pixel electrode, respectively;
   wherein a gate and a source of the second thin film transistor are connected to the first gate line and the second pixel electrode, respectively; and
   wherein a drain of the first thin film transistor and a drain of the second thin film transistor both are connected to the common electrode.

14. The liquid crystal display panel according to claim 13, wherein the first pixel electrode and the second pixel electrode are respectively connected to a second gate line and a third gate line via corresponding thin film transistors.

15. The liquid crystal display panel according to claim 10, wherein:
   the common electrode is connected to a plurality of pixel electrodes in a pixel electrode row where the first pixel electrode is located, and the common electrode is further connected to a plurality of pixel electrodes in a pixel electrode row where the second pixel electrode is located; or
   the common electrode is connected to a plurality of pixel electrodes in a pixel electrode column where the first pixel electrode is located, and the common electrode is further connected to a plurality of pixel electrodes in a pixel electrode column where the second pixel electrode is located.

16. The liquid crystal display panel according to claim 10, wherein the common electrode comprises a plurality of common electrode lines,
   wherein the plurality of common electrode lines are arranged side by side along a direction of the data lines, or the plurality of common electrode lines are arranged side by side along a direction of the gate lines.

17. The liquid crystal display panel according to claim 10, wherein the common electrode comprises a plurality of common electrode lines, which comprise a plurality of row common electrode lines and a plurality of column common electrode lines, wherein the plurality of row common electrode lines are arranged side by side along the direction of the gate lines, and the plurality of column common electrode lines are arranged side by side along the direction of the data lines.

18. The liquid crystal display panel according to claim 10, wherein the array substrate further comprises a signal output terminal which is connected to the common electrode and configured to output signals of the common electrode to a common electrode of an opposite substrate.

19. The liquid crystal display panel according to claim 10, further comprising a color filter, wherein the color filter comprises a common electrode, and the common electrode in the color filter is connected to the common electrode in the array substrate.

* * * * *